United States Patent
Ouvrier-Buffet (10) Patent No.: US 10,627,531 B2
(45) Date of Patent: Apr. 21, 2020

(54) DEVICE FOR COUNTING PARTICLES FOR A RADIATION DETECTOR

(71) Applicant: Commissariat à l'Énergie Atomique et aux Énergies Alternatives, Paris (FR)

(72) Inventor: Patrice Ouvrier-Buffet, Saint-Jorioz (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 29 days.

(21) Appl. No.: 16/093,607

(22) PCT Filed: Apr. 10, 2017

(86) PCT No.: PCT/FR2017/050860
§ 371 (c)(1),
(2) Date: Oct. 12, 2018

(87) PCT Pub. No.: WO2017/178745
PCT Pub. Date: Oct. 19, 2017

(65) Prior Publication Data
US 2019/0120975 A1   Apr. 25, 2019

(30) Foreign Application Priority Data
Apr. 14, 2016 (FR) ...................... 16 53312

(51) Int. Cl.
*G01T 1/20* (2006.01)
*G01T 1/17* (2006.01)
(Continued)

(52) U.S. Cl.
CPC ............... *G01T 1/17* (2013.01); *G01T 1/171* (2013.01); *G01T 1/247* (2013.01); *H03K 5/24* (2013.01)

(58) Field of Classification Search
CPC ........... G01T 1/17; G01T 1/171; G01T 1/247; G01T 1/1606; G01T 1/18; G01T 1/24;
(Continued)

(56) References Cited

U.S. PATENT DOCUMENTS 8,748,832 B2 * 6/2014 Brambilla ............... G01T 1/241
250/370.01

FOREIGN PATENT DOCUMENTS

WO   WO 2008/146230 A2   12/2008
WO   WO 2011/039312 A1   4/2011

OTHER PUBLICATIONS

PCT/FR2017/050860, Jul. 21, 2017, International Search Report and Written Opinion.
(Continued)

*Primary Examiner* — Irakli Kiknadze
(74) *Attorney, Agent, or Firm* — Wolf, Greenfield & Sacks, P.C.

(57) ABSTRACT

A circuit for counting photons, including: an input terminal intended to be connected to a detector of ionising radiation; an analogue stage for generating a pulsed signal, each pulse of which has an amplitude proportional to the energy released by an interaction of at least one photon in the detector; and a digital stage including: at least one first comparator for comparing the amplitude of the pulses to a first threshold; a differentiator circuit for determining periods in which the derivative of the pulse signal is of a given sign; at least one first logic gate for combining the outputs of the first comparator and the differentiator circuit; and at least one first counter for counting the number of pulses present on the output of the combining element.

7 Claims, 5 Drawing Sheets

(51) Int. Cl.
*H03K 5/24* (2006.01)
*G01T 1/24* (2006.01)

(58) Field of Classification Search
CPC ......... G01T 1/241; G01T 1/2928; H03K 5/24;
H03K 5/04; H03K 5/08; A61B
2560/0223; A61B 2560/0238; A61B
6/4241; A61B 6/5205; A61B 6/5258;
A61B 6/582; A61B 6/585; G01J 1/44
USPC .................................................... 250/370.1
See application file for complete search history.

(56) References Cited

OTHER PUBLICATIONS

PCT/FR2017/050860, Oct. 16, 2018, International Preliminary Report on Patentability.
International Search Report dated Jun. 21, 2017 in connection with Application No. PCT/FR2017/050860.
International Search Report and Written Opinion for International Application No. PCT/FR2017/050860, dated Jul. 21, 2017.
International Preliminary Report on Patentability for International Application No. PCT/FR2017/050860, dated Oct. 16, 2018.

* cited by examiner

DEVICE FOR COUNTING PARTICLES FOR A RADIATION DETECTOR

This Application is a national stage filing under 35 U.S.C. 371 of International Patent Application Serial No. PCT/FR2017/050860, filed Apr. 10, 2017, which claims the priority benefit of French patent application FR16/53312, filed Apr. 14, 2016. The entire contents of these applications are incorporated herein by reference in their entirety.

BACKGROUND

The present description generally relates to electronic systems and, more particularly, to the forming of a particle counting device for a radiation detector. The present disclosure more specifically relates to the counting of photons captured by a detector made of a semiconductor material.

DISCUSSION OF THE RELATED ART

A photon detector is most often formed of a pixel array, each pixel comprising a semiconductor photodetector area associated with an electronic system for counting the photons detected in the area. The semiconductor detection area, for example, made up of germanium or of silicon, is sensitive to the ionizing radiation formed of high-energy photons, for example X or gamma rays. The energy of the photons, generally detectable by such semiconductor detectors, is in the range from 1 keV to a few MeV.

The detectors targeted by the present disclosure have multiple applications. They can for example be found in medical imaging devices (radiography, scanner, etc.), in devices of radiographic examination of objects (for example, luggage control in airports), in nuclear waves, etc.

In such applications, the detector is a spectrometer comprising a radiation source emitting photons with different energy levels. The radiation crosses an element (material, object, body, etc.) to be analyzed before reaching a photon detector. The photon detector then uses the different quantities of photons received with different energies to determine the materials which have been crossed.

The photon detectors targeted by the present disclosure use a counting of the number of photons received in different energy bands by the different detection areas. Each photon detector of the array has a similar structure.

For reasons of sensitivity of the detectors and to avoid, among others, for a plurality of photons having a lower energy to be counted as a high-energy photon, which causes an interpretation error, one generally has, in multiple-level detection devices, to decrease the pixel size. However, problems of charge sharing between a plurality of neighboring pixels then come up.

There is a need to improve photon detector devices based on a counting of the number of photons.

Document WO 2008/146230 describes a photon counting system where photon counters are incremented with respect to determined thresholds. The value of the counters is then modified after a processing in a chain including a differentiator. The processing performed is a correction processing subsequent to the counting.

SUMMARY

An embodiment overcomes all or part of the disadvantages of photon counting devices.

An embodiment provides a solution particularly adapted to multiple-level counting devices.

An embodiment provides a solution compatible with a digital processing.

Thus, an embodiment provides a photon counting circuit, comprising:
an input terminal intended to be connected to an ionizing radiation detector;
an analog pulse signal generation stage, each of the pulses of the pulse signal having an amplitude proportional to the energy released by an interaction of at least one photon in the detector; and
a digital stage comprising:
at least one first comparator of the amplitude of the pulses with respect to a first threshold;
a differentiating circuit for determining the periods when the derivative of the pulse signal has a same sign;
at least one first AND-type logic gate for combining the outputs of the first comparator and of the differentiating circuit; and
at least one first counter of the number of pulses present at the output of the combination element.

According to an embodiment, the differentiating circuit and the first comparator receive the same signal.

According to an embodiment, the combination element is a logic gate performing an AND function.

According to an embodiment, the digital stage comprises a plurality of paths in parallel, each path comprising:
a comparator of the amplitude of the pulses with respect to a threshold;
an element for combining the outputs of the comparator of the concerned path and of the differentiating circuit; and
a counter of the number of pulses present at the output of the combination element of the concerned path.

According to an embodiment, the thresholds of the different paths are different and are increasing from one path to the next one.

According to an embodiment, the number supplied by the counter of a path is decreased by the number supplied by the counter of the path having a threshold of immediately greater value.

According to an embodiment, the differentiating circuit is common to all paths.

An embodiment provides a system of examination by an ionizing radiation comprising at least one circuit such as hereabove.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, only those elements which are useful to the understanding of the described embodiments have been shown and will be detailed. In particular, the forming of a system using one or a plurality of photon counting circuits has not been detailed, the described embodiments being compatible with current uses of such systems. Further, the structure and the forming of the circuits upstream of the counting circuit, as well as the forming of the detectors made of semiconductor material have not been detailed either, the described embodiments being compatible with usual implementations of such detectors and circuits. It should be noted that, in the drawings, the structural and/or functional elements common to the different embodiments may be designated with the same reference numerals and may have identical structural, dimensional, and material properties. Unless otherwise specified, expressions "approximately", "substantially", and "in the order of" mean to within 10%, preferably to within 5%.

Figure 1:
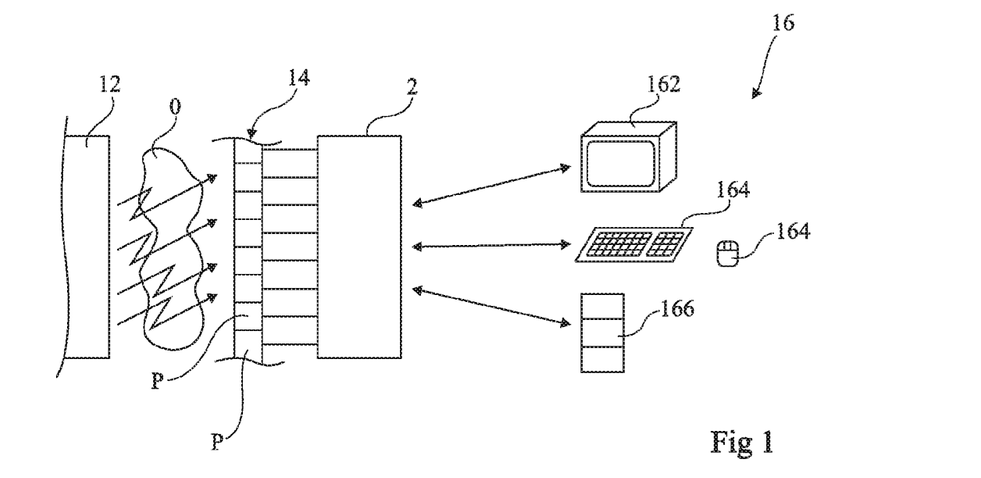
FIG. 1 is a simplified representation of a system of examination by ionizing radiation.

FIG. 1 is a simplified representation of a system of examination by ionizing radiation.

Such a system generally comprises a source 12 of emission of an ionizing radiation, for example, of X or gamma rays. A photon detector 14, formed of a plurality of detection pixels P made of semiconductor material, arranged, for example, in an array, is placed opposite source 12. An object O, be it an element or a body, to be analyzed, is placed between source 12 and detector 14 so that the radiation emitted by source 12 crosses (or not, or more or less, according to the encountered materials) object O before reaching detector 14. Detector 14 is coupled to an electronic device 2 for processing the information supplied by the detector. In practice, each pixel P of detector 14 is associated with a counting circuit. Device 2 thus comprises as many counting circuits as sensor 14 comprises pixels P. The results of the counting are processed, most often, by computer equipment 16 comprising user interface devices (for example, one or a plurality of control screens 162, one or a plurality of input-output devices 164 of keyboard, mouse, or other type), storage elements 166, for example, of database, remote storage, or other type. The elements of such an examination system, except for the counting circuits, are not modified by the implementation of the described embodiments.

Figure 2:
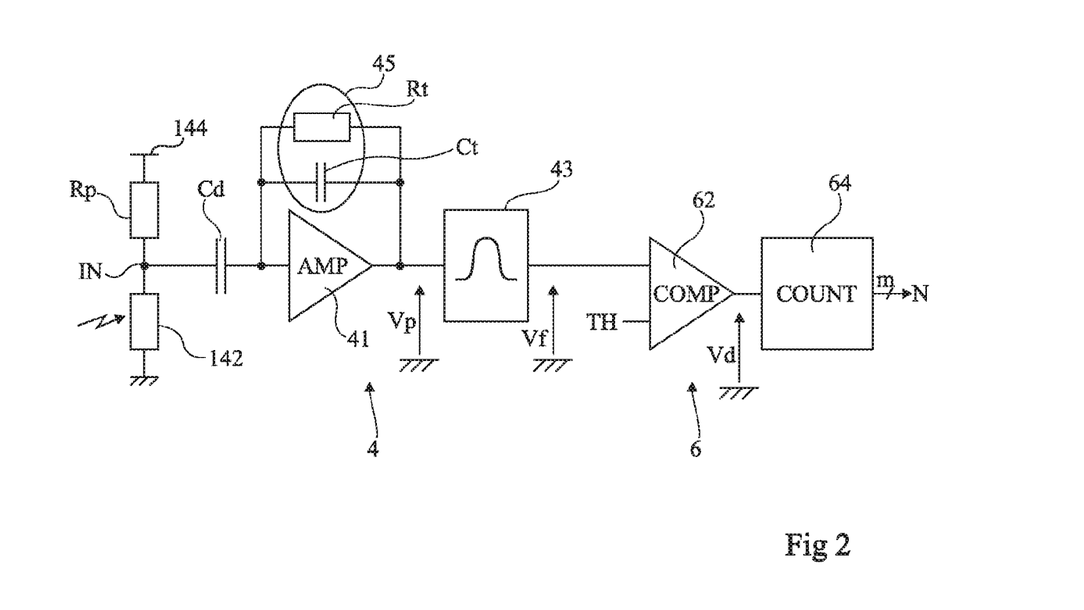
FIG. 2 shows, in the form of blocks, an example of a photon counting circuit.

FIG. 2 shows, in the form of blocks, an example of a photon counting circuit of a processing device (for example, of device 2 of FIG. 1).

The detection element (the pixel) is a photodetector 142 made of a semiconductor material, for example, of phototransistor type, series-connected with a biasing resistor Rp, between a terminal 144 of application of a potential (positive or negative) and the ground. The conduction of photodetector 142 and accordingly the level of the signal present at junction point IN of resistor Rp and of photodetector 142 are conditioned by the number and the energy of the received photons. Node IN forms the input terminal of the photon counting circuit. This circuit comprises an analog processing or shaping stage 4 and a digital processing or actual counting stage 6.

The signal present on terminal IN is processed by an amplifier 41 (AMP) of stage 4 having an input terminal coupled to terminal IN by a decoupling capacitor Cd and having an output terminal coupled to an input terminal of a shaping circuit 43 of bandpass or pulse filter type. A resistive and capacitive cell 45, for example formed of a resistor Rt in parallel with a capacitor Ct, couples the output of amplifier 41 to its input and sets the integration time constant. Filter 43 of stage 4 converts signal Vp, supplied by amplifier 41, into a pulse signal Vf, enabling to temporally isolate the received photons, the amplitude of the pulses being a function of the energy level of the received photons.

Output signal Vf of filter 43 is sent onto a first input of a comparator 62 (COMP) of stage 6, having a second input receiving a comparison threshold TH. Comparator 62 performs an analog-to-digital conversion. The output of comparator 62 supplies a digital signal representative of the number of photons received with an energy greater than threshold TH. Output signal Vd of comparator 62 is processed by a counter 64 having its output providing, for example, a number N over a plurality of bits in parallel. The structure of the circuit of FIG. 2 is usual.

In practice, in most applications, a multiple-level counting device, that is, capable of counting the number of photons received in different energy bands, is needed. For this purpose, the counting circuit associated with each photodetector element 142 comprises a plurality of counters (at least two) associated with a plurality of comparators having comparison thresholds different from one another.

Figure 3:
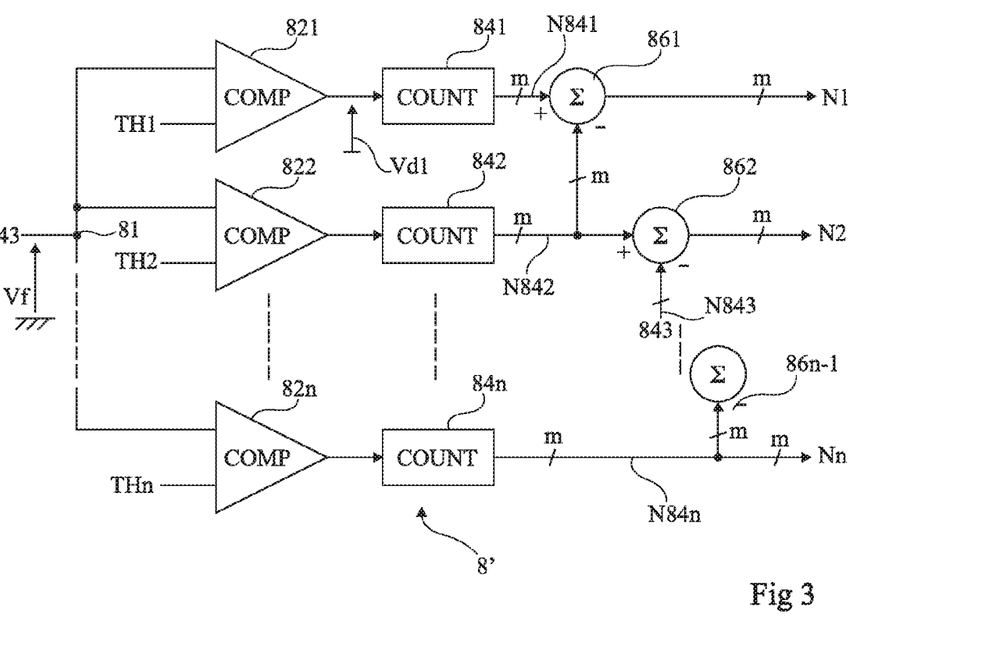
FIG. 3 shows, in the form of blocks, an example of a usual multiple-level counting circuit.

FIG. 3 shows in the form of blocks an example of a multiple-level counting circuit. In FIG. 3, only digital stage 8' of the counting circuit has been shown, the analog stage being identical to that shown in FIG. 2. In other words, an input terminal 81 of circuit 8' receives the output signal Vf of the filter 43 of stage 4 of FIG. 2.

Stage 8' comprises a number n of paths i (with i ranging from 1 to n) corresponding to the number of level ranges which are desired to be distinguished in the received signal. Each path i comprises a comparator 82i (COMP—821, 822, ..., 82n in FIG. 3) having a first input coupled to terminal 81 and having a second input receiving a threshold THi (TH1, TH2, ..., THn in FIG. 3). The output of each comparator 82i is coupled to the input of a counter 84i (COUNT—841, 842, ..., 84n in FIG. 3). The output N841, N842, N843, ..., N84n of each counter 84i supplies a number over m bits representing the number of photons having an energy higher than threshold THi of the concerned path.

Thresholds THi are different from one another and have, for example, decreasing values from threshold TH1 to threshold THn. The interval between a threshold of rank i and the next threshold of rank i+1 shows the range detected by the path of rank i. To obtain the number of photons having an energy in the range between thresholds THi and THi+1, the number supplied by counter 84i+1 is subtracted to that supplied by counter 84i. For this purpose, the output of a counter 84i of rank i is coupled to a first input + of a subtractor 86i (861, 862, ..., 86n−1 in FIG. 3) having a second input − (subtraction) receiving the number supplied by the counter 84i+1 of rank i+1 (842, 843, ..., 84n in FIG. 3). Each subtractor 86i is for example an adder (Σ) assembled as a subtractor. The counter 84n of rank n directly supplies the number of photons in the range of highest energy (higher than THn).

Figure 4A:
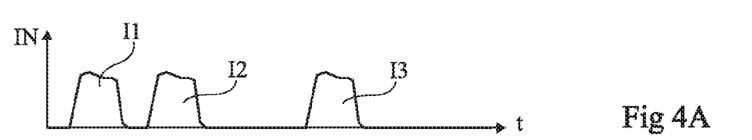
FIGS. 4A, 4B, 4C, and 4D illustrate, in timing diagrams, an example of operation of the circuit of FIG. 2.
Figure 4B:
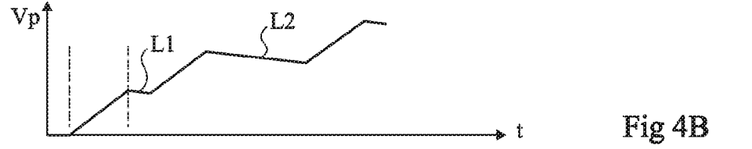
Figure 4C:
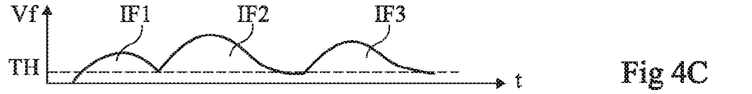
Figure 4D:
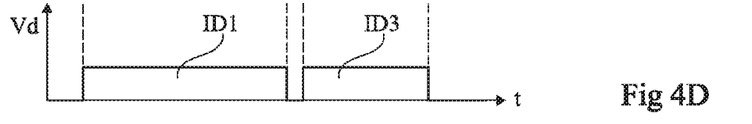

FIGS. 4A, 4B, 4C, and 4D illustrate, in timing diagrams, an example of operation of the circuit of FIG. 2 in the case of temporally close photons. This may also resemble the operation of a path of the stage of FIG. 3 in a similar situation. FIG. 4A shows an example of a signal present at input IN (FIG. 2) of the counting circuit. FIG. 4B shows an example of a corresponding shape of signal Vp at the output of amplifier 41 (FIG. 2). FIG. 4C shows an example of corresponding shape of signal Vf at the output of pulse filter 43 (FIG. 2) and at the input of the digital stage (6, FIG. 2 or 8', FIG. 3). FIG. 4D shows an example of corresponding shape of signal Vd at the output of comparator 62 (FIG. 2) or of the signal Vdi of a comparator 82i having the same threshold.

In all the timing diagrams of the drawings (FIGS. 4, 5, and 7), signals which are positive with respect to ground are arbitrarily taken as an example.

According to this example, the presence, in signal IN, of three pulses I1, I2, and I3 successively representing three photons having a similar energy (approximately identical amplitude of the pulses) is assumed. Two first pulses I1 and I2 are close to each other with respect to the time interval separating pulse I2 from third pulse I3. At the output of amplifier 41 (FIG. 4B), the performed integration causes an increase in signal Vp with two stages L1 and L2 representative of the intervals between each pulse. Once signal Vd has been filtered, the resulting signal Vf comprises three analog pulses IF1, IF2, IF3, the last two being more distant in time from each other, they cause a stronger damping of the signal between the second and third pulses. Assuming that threshold TH (or THi) is located between the lower damping levels between pulses IF1 and IF2 and between pulses IF1 and IF3, a phenomenon of accumulation or of stacking of the first two pulses can be observed. Indeed, signal Vf does not have time to fall back below the threshold between pulses IF1 and IF2. Signal Vd then comprises a relatively long pulse ID1 and a short pulse ID2 with respect to pulse ID1. As a result, the counter (64, FIG. 2 or 84i, FIG. 3) will count one pulse ID1 while it should have counted two.

Figure 5A:
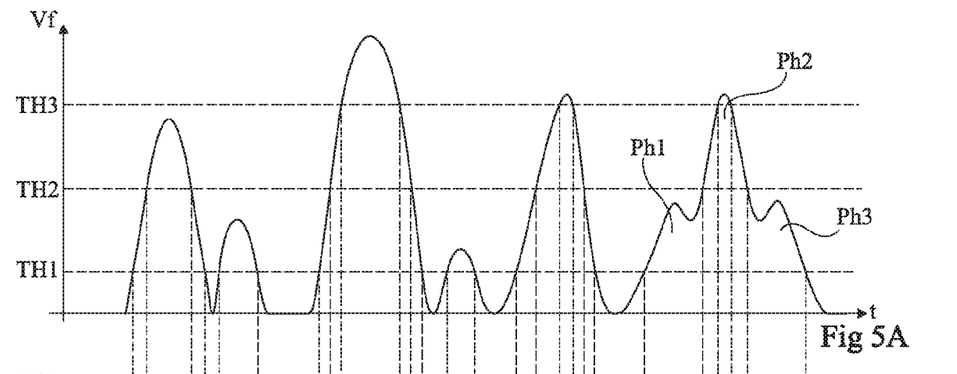
FIGS. 5A, 5B, 5C, and 5D illustrate, in timing diagrams, an example of operation of the circuit of FIG. 3 assuming an implementation with three paths.
Figure 5B:
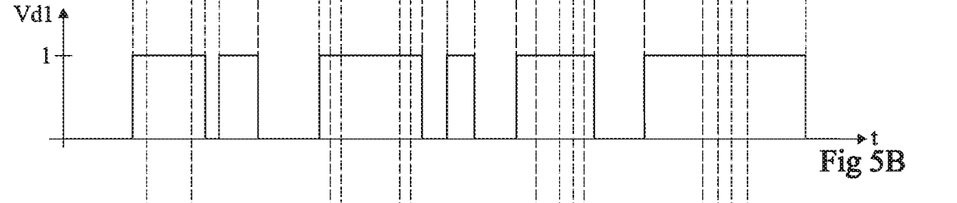
Figure 5C:
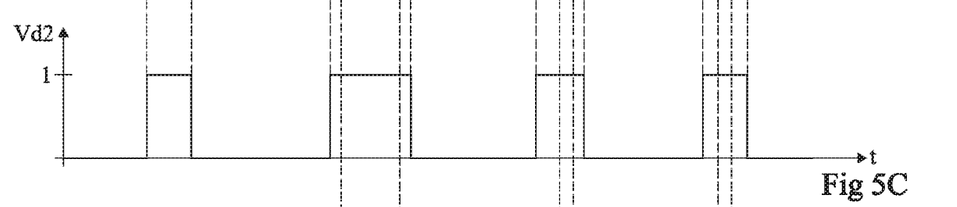
Figure 5D:
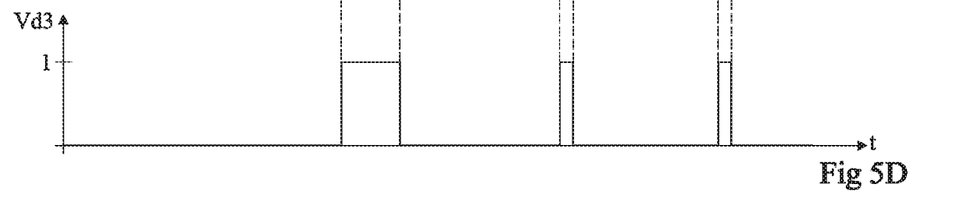

FIGS. 5A, 5B, 5C, and 5D illustrate, in timing diagrams, an example of operation of stage 8' of FIG. 3 assuming an implementation with three paths (n=3). FIG. 5A shows an example of variation of signal Vf. FIGS. 5B, 5C, and 5D show corresponding examples of the shapes of outputs Vd1, Vd2, and Vd3 of comparators 821, 822, and 823 of the three paths.

During all the periods when the amplitude of signal Vf exceeds respective thresholds TH1, TH2, and TH3, signals Vd1, Vd2, and Vd3 are respectively in the high state (logic state 1) and are in the low state (logic state 0) for the rest of the time. The selection of the logic state according to the high or low state is arbitrary and conventional. It is assumed that signal Vf successively translates a photon having an intermediate energy level (between thresholds TH2 and TH3), a low-level photon (between thresholds TH1 and TH2), a high-level photon (higher than threshold TH3), a low-level photon, a high-level photon, and finally a high-level photon Ph2 surrounded by two low-level photons Ph1 and Ph3 close in time and submitted to the stacking phenomenon illustrated in FIGS. 4A to 4D. It is assumed that photons Ph1, Ph2, and Ph3 are sufficiently close in time for signal Vf not to have the time to fall below threshold TH1 between photons Ph1 and Ph2, and between photons Ph2 and Ph3. Signals Vd1, Vd2, and Vd3 thus respectively comprise 6, 4, and 3 pulses which are counted by counters 841, 842, and 843. As a result, numbers N3, N2, and N1 respectively supplied by counter 843 and by adders 862 and 861, for the duration shown in FIGS. 5A to 5D, are 3, 1 (4-3), and 2 (6-4). There thus is, due to the stacking of photons Ph1, Ph2, and Ph3, a counting error (the correct count being 3, 1, 4).

In the example of FIGS. 5A to 5D, the number of high-level photons is correct. However, there may however occur that the closeness in time and that the level differences between two successive photons are such that the circuit sees a high-level photon while there is none and that there are two intermediate level photons.

The stacking problem is particularly present for counting devices meant to operate in wide energy ranges. Further, the narrower the energy ranges, the higher the risk.

Decreasing the size of the pixels, and thus of the detectors, may decrease the phenomenon. However, if the pixels become too small, a phenomenon of charge sharing between neighboring pixels can be observed, which causes other detection errors.

Figure 6:
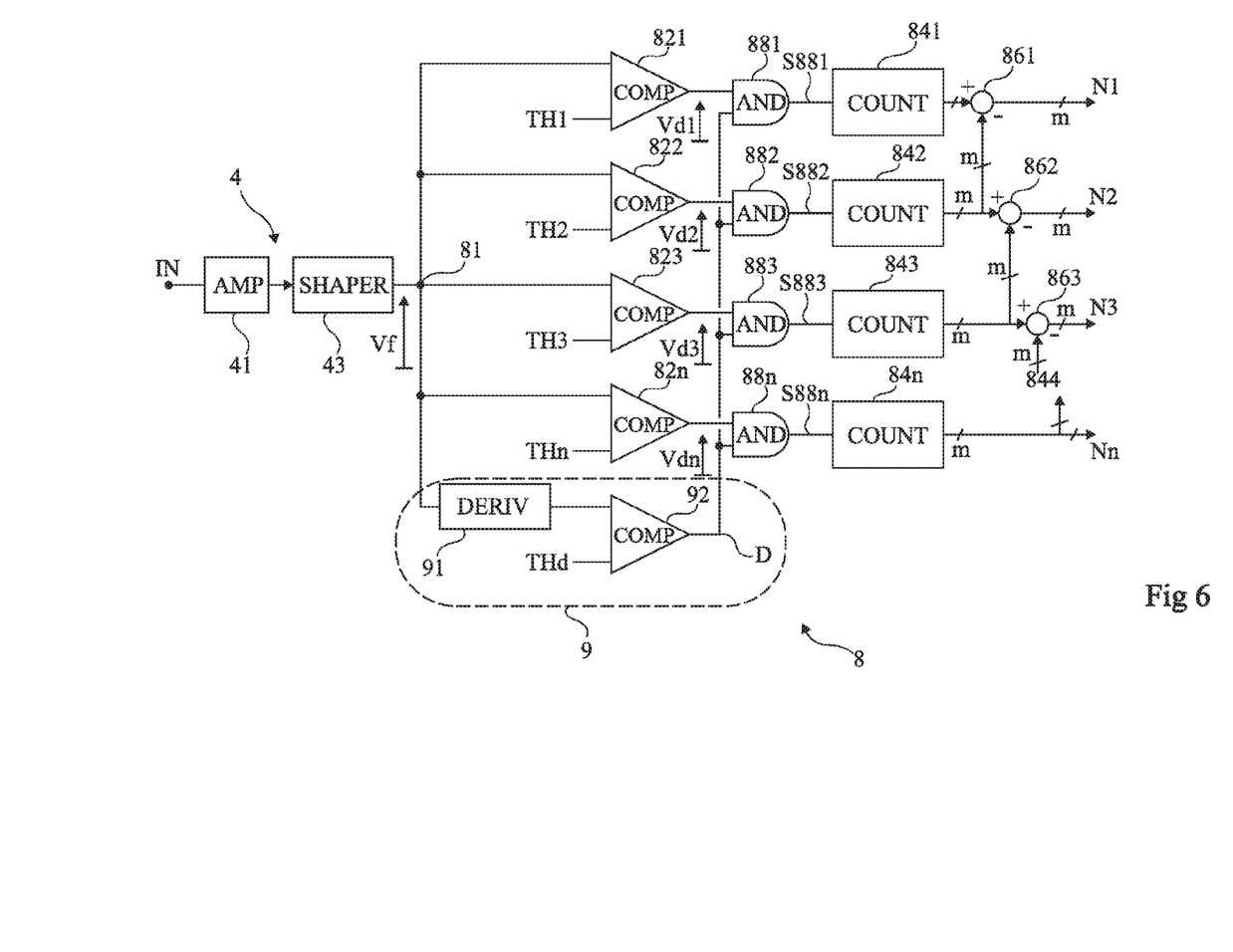
FIG. 6 shows, in the form of blocks, an embodiment of a multiple-level counting circuit.

FIG. 6 shows, in the form of blocks, an embodiment of a multiple-level counting circuit.

Such a counting circuit comprises an analog stage 4 of the type illustrated in relation with FIG. 2 (amplifier 41 (AMP) and shaping circuit 43 (SHAPER) of bandpass filter or pulse filter type). The counting circuit also comprises a digital stage 8 with n paths which comprises, among others, the elements of the circuit of FIG. 3 (comparators 82i from 1 to n, counters 84i from 1 to n, and adders 86i from 1 to n−1). Stage 8 also comprises a differentiator 9 (DERIV) having the function of supplying a digital signal D representative of the periods of signal Vf during which the latter increases. Stage 8 further comprises n AND-type logic gates 88i (881, 882, 883, . . . , 88n in FIG. 6) interposed between the respective outputs of comparators 82i and the inputs of the associated counters 84i and combining the respective outputs of comparators 82i with signal D. A first input of each logic gate 88i is coupled to the output of the comparator 82i of same rank. The second inputs of gates 88i are coupled to the output of differentiator 9 and receive signal D. The respective outputs S88i (S881, S882, S883, . . . S88n in FIG. 6) of gates 88i are coupled to the inputs of the counters 84i of corresponding rank.

Differentiator 9 may be formed in different ways. For example, it comprises a circuit 91 detecting the sign of the slope of signal Vf in analog fashion and supplying a digitized signal through a comparator 92 (COMP). A first input of comparator 92 is coupled to the output of circuit 91 and a second input of comparator 92 receives a threshold THd. The comparator output supplies signal D. Threshold THd may theoretically be zero but is, in practice, preferably selected to be greater than the level considered as representative of the measurement noise. Further, threshold THd is lower than the lowest threshold TH1 of stage 8.

Other types of differentiators may be used, for example, a digital differentiator, a differentiator based on switched capacitors, etc.

As a variation, differentiator 9 may supply a signal D representative of the periods when signal Vf decreases.

Figure 7A:
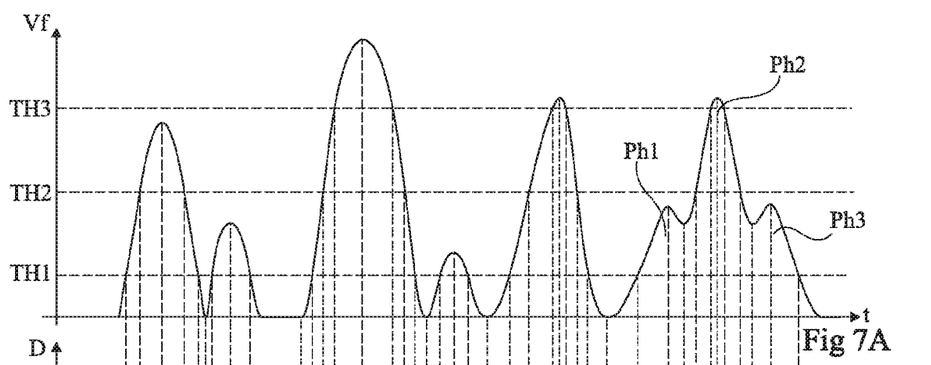
FIGS. 7A, 7B, 7C, 7D, 7E, 7F, 7G, and 7H illustrate, in timing diagrams, an example of operation of the circuit of FIG. 6.
Figure 7B:
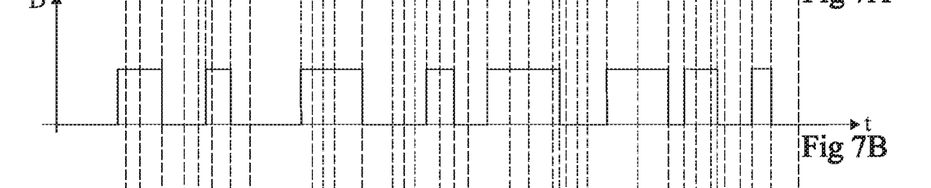
Figures 7C, 7D:
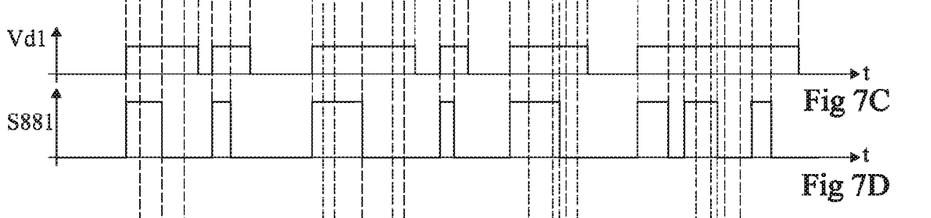
Figures 7E, 7F:
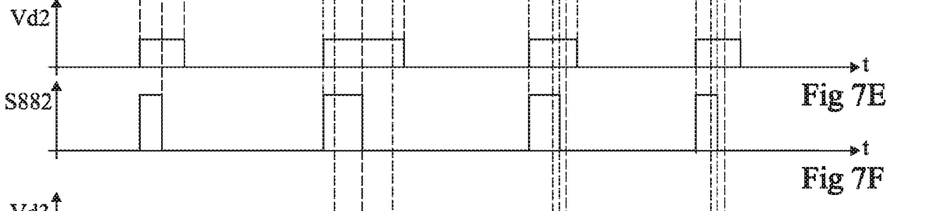
Figures 7G, 7H:
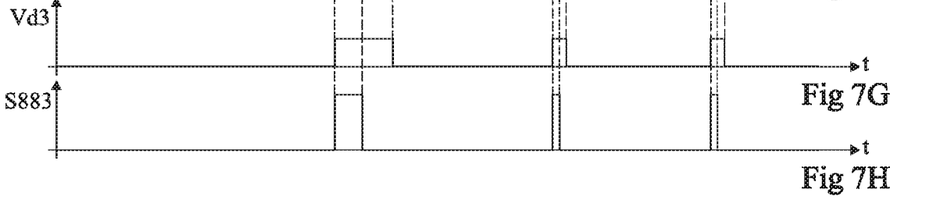

FIGS. 7A, 7B, 7C, 7D, 7E, 7F, 7G, and 7H illustrate, in timing diagrams, an example of operation of stage 8 of FIG. 6 assuming an implementation with three paths (n=3). FIG. 7A shows an example of variation of signal Vf. FIG. 7B shows a corresponding example of the variation of output signal D of differentiator 9. For simplification, a zero threshold THd is considered. FIGS. 7C, 7E, and 7G show corresponding examples of the variations of outputs Vd1, Vd2, and Vd3 of comparators 821, 822, and 823 of the three paths. FIGS. 7D, 7F, and 7H show corresponding examples of the variations of outputs S881, S882, and S883 of logic gates 881, 882, and 883 of the three paths, that is, the input signals of counters 841, 842, and 843.

Similarly to the embodiment of FIG. 3, during all the periods when the amplitude of signal Vf exceeds respective thresholds TH1, TH2, and TH3, signals Vd1, Vd2, and Vd3 are respectively in the high state (logic state 1) and are in the low state (logic state 0) for the rest of the time. Here again, the selection of the logic state according to the high or low state is arbitrary and conventional. The example of FIG. 7A takes the same example as in FIG. 5A. It is thus assumed that signal Vf successively translates a photon having an intermediate energy level (between thresholds TH2 and TH3), a low-level photon (between thresholds TH1 and TH2), a high-level photon (greater than threshold TH3), a low-level photon, a high-level photon, and finally a high-level photon Ph2 surrounded by two low-level photons Ph1 and Ph3 close in time and submitted to a stacking phenomenon. Photons Ph1, Ph2, and Ph3 are sufficiently close in time for signal Vf not to have the time to fall below threshold TH1 between photons Ph1 and Ph2, and between photons Ph2 and Ph3. As in FIGS. 5B, 5C, and 5C, signals Vd1, Vd2, and Vd3 thus respectively comprise six, four, and three pulses.

Signal D, indicative of the periods of positive derivative of signal Vf, comprises eight pulses representing the rising periods of signal Vf. In particular, at the level of photons Ph1, Ph2, and Ph3, signal D comprises three pulses. Signals S881, S882, and S883, which result from the combinations of signal D with signals Vd1, Vd2, and Vd3, comprise one pulse for each period with, further, at the level of photons Ph1, Ph2, and Ph3, a division of the single pulse of FIG. 7C into three pulses in FIG. 7D. As a result, numbers N3, N2, and N1 respectively supplied by counter 843 and by adders 862 and 861 are, for the duration shown in FIGS. 7A to 7H, 3, 1 (4-3), and 4 (6-4).

The other stacking phenomena, such as for example two photons sufficiently close to be cumulated are also corrected by the described circuit, provided for the derivative of the signal to change direction between the two photons.

An advantage of the embodiment of FIG. 6 is that it solves stacking problems, be it in a single- or multiple-level system.

Another advantage is that this embodiment is compatible with a tradeoff on the size of the pixels to improve the resolution of the device.

Another advantage of the described embodiments it that, due to the taking into account (combination) of the result of the differentiator before incrementing the counters, the counting is performed in real time and requires no post-processing.

As a specific embodiment, pixels having a size in the range from 400 μm*400 μm to 700 μm*700 μm provide an appropriate pixel size.

Various embodiments have been described. Various alterations, modifications, and improvements will occur to those skilled in the art. In particular, the selection of the thresholds of the different comparators and of the differentiator depends on the application and, among others, on the energy range of the detector. Further, the practical implementation of the embodiments which have been described is within the abilities of those skilled in the art based on the functional indications given hereabove.

The invention claimed is:

1. A photon counting circuit, comprising:
   an input terminal intended to be connected to an ionizing radiation detector;
   an analog pulse signal generation stage, each of the pulses of the pulse signal having an amplitude proportional to the energy released by an interaction of at least one photon in the detector; and
   a digital stage comprising:
      at least one first comparator of the amplitude of the pulses with respect to a first threshold;
      a differentiating circuit for determining the periods when the derivative of the pulse signal has a same sign;
      at least one first AND-type logic gate for combining the outputs of the first comparator and of the differentiating circuit; and
      at least one first counter of the number of pulses present at the output of the combination element.

2. The circuit of claim 1, wherein the differentiating circuit and the first comparator receive the same signal.

3. The circuit of claim 1, wherein the digital stage comprises a plurality of paths in parallel, each path comprising:
   a comparator of the amplitude of the pulses with respect to a threshold;
   an element for combining the outputs of the comparator of the concerned path and of the differentiating circuit; and
   a counter of the number of pulses present at the output of the combination element of the concerned path.

4. The circuit of claim 3, wherein the thresholds of the different paths are different and are increasing from one path to the next one.

5. The circuit of claim 4, wherein the number supplied by the counter of a path is decreased by the number supplied by the counter of the path having a threshold having an immediately greater value.

6. The circuit of claim 3, wherein the differentiating circuit is common to all paths.

7. A system of examination by ionizing radiation comprising at least one circuit of claim 1.

* * * * *